(12) United States Patent
Murayama

(10) Patent No.: US 6,725,434 B2
(45) Date of Patent: Apr. 20, 2004

(54) METHOD OF VERIFYING DESIGNED CIRCUITS

(75) Inventor: Toshio Murayama, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/024,177

(22) Filed: Dec. 21, 2001

(65) Prior Publication Data

US 2002/0083403 A1 Jun. 27, 2002

(30) Foreign Application Priority Data

Dec. 25, 2000 (JP) ..................... P2000-392822

(51) Int. Cl.[7] .............................. G06F 17/50
(52) U.S. Cl. ............................. 716/5; 716/4
(58) Field of Search ...................... 716/1–14

(56) References Cited

U.S. PATENT DOCUMENTS 6,094,527 A * 7/2000 Tsukamoto et al. ........... 703/18

OTHER PUBLICATIONS

"General Purpose Linear Devices Databook" (1989 Edition), National Semiconductor Corporation, pp. 3–277 to 3–286.*

* cited by examiner

Primary Examiner—Matthew Smith
Assistant Examiner—Sun James Lin
(74) Attorney, Agent, or Firm—Rader, Fishman & Grauer PLLC; Ronald P. Kananen

(57) ABSTRACT

Disclosed is a designed-circuit-verifying method for verifying an LSI or a wiring-substrate circuit with ease at the design stage of the circuit. An analysis based on simulation of a circuit allows electrical characteristics of a designed circuit to be detected at a design stage and compared with reference data. In accordance with a result of the comparison, an item to be corrected, the location of the item and other information on the item can be identified. In addition, since details of the correction can be displayed at an identified position on the designed circuit, the design of the circuit can be corrected. Thus, the design efficiency of the circuit can be improved.

3 Claims, 7 Drawing Sheets

TYPICAL DISPLAY 1  DISPLAY OF VALUES OF SUPPLIED-VOLTAGE DROPS
CELL NAME   SYSTEM1:0.3V(0.2+0.1)
            SYSTEM2:0.35V(0.15+0.2)

TYPICAL DISPLAY 2  DISPLAY OF VALUES OF ACTUALLY-APPLIED VOLTAGES
CELL NAME   SYSTEM1:1.2V   SYSTEM2:1.15V

TYPICAL DISPLAY 3  GRAPHICAL DISPLAY
CELL AND MACROS ARE COLORED DIFFERENTLY
IN DEPENDENCE ON THE VALUES

TYPICAL DISPLAY 1  DISPLAY OF VALUES OF SUPPLIED-VOLTAGE DROPS
CELL NAME  SYSTEM1:0.3V(0.2+0.1)
SYSTEM2:0.35V(0.15+0.2)

TYPICAL DISPLAY 2  DISPLAY OF VALUES OF ACTUALLY-APPLIED VOLTAGES
CELL NAME  SYSTEM1:1.2V  SYSTEM2:1.15V

TYPICAL DISPLAY 3  GRAPHICAL DISPLAY
CELL AND MACROS ARE COLORED DIFFERENTLY
IN DEPENDENCE ON THE VALUES

LSI LAYOUT

DISPLAY OF CURRENT DIRECTIONS

WARNING OF REVERSE CURRENT

TYPICAL DISPLAY 1   DISPLAY OF COORDINATES
X1=1000, Y1=500  Reverse Current

TYPICAL DISPLAY 2   GRAPHICAL DISPLAY
REVERSE-CURRENT LOCATION IS COLORED

TYPICAL DISPLAY 1  VALUES ARE DISPLAYED IN
A SORTED ASCII FORM
CELL 1:0.1mA/$\mu m^2$
CELL 2:0.09mA/$\mu m^2$
CELL 3:0.08mA/$\mu m^2$

TYPICAL DISPLAY 2  GRAPHICAL DISPLAY
CELLS AND MACROS ARE COLORED DIFFERENTLY
IN DEPENDENCE ON THE VALUES

WARNING OF INACTIVE WIRES

TYPICAL DISPLAY 1   DISPLAY OF COORDINATES
　　　　　　　　　　X1=1000,Y1=500　Small　Current　0.0000
　　　　　　　　　　X1=2000,Y1=500　Small　Current　0.0001E-15
　　　　　　　　　　X1=2500,Y1=500　Small　Current　0.00011E-15

TYPICAL DISPLAY 2   GRAPHICAL DISPLAY

TYPICAL DISPLAY 1   DISPLAY OF COORDINATES
　　　　　　　　　X1=1000, Y1=500   Layer=1 and 2   Difference   0.150V
　　　　　　　　　X1=2000, Y1=500   Layer=1 and 3   Difference   0.130V
　　　　　　　　　X1=2500, Y1=500   Layer=1 and 2   Difference   0.100V

TYPICAL DISPLAY 2   GRAPHICAL DISPLAY

NO VIA HOLE
VOLTAGE-DROP DIFFERENCE AT LEAST
EQUAL TO PREDETERMINED VALUE
NO SIGNAL WIRE BETWEEN LAYERS

METHOD OF VERIFYING DESIGNED CIRCUITS

BACKGROUND OF THE INVENTION

The present invention relates to an LSI and a wiring-substrate circuit. More particularly, the present invention relates to a method used for verifying a designed circuit in order to detect and correct electrical characteristics of circuit components composing the designed circuit.

As has been commonly known, there are voltage drops referred to as so-called IR drops inside an LSI or a wiring-substrate circuit from the level of a voltage appearing at a power-supply pin of the LSI or the wiring-substrate circuit due to an effect of an operation current flowing during an operation of the LSI or the wiring-substrate circuit.

There has been proposed a variety of techniques for analyzing the phenomenon of a drop in power-supply voltage. In accordance with the techniques, however, a result of analysis is revealed by merely displaying the magnitude of a voltage drop along a wire, at a via hole or a cell terminal, or merely displaying a current density. There has not been reported a technique whereby a result of analysis identifies the location of a wire abnormality so as to allow the abnormality to be corrected with ease.

SUMMARY OF THE INVENTION

It is thus an object of the present invention addressing the problems described above to provide a designed-circuit-verifying method for verifying a designed circuit with ease at a designed stage of the circuit or an LSI containing the circuit.

To solve the problems described above, according to a first aspect of the present invention, there is provided a designed-circuit-verifying method including: a process of designing a predetermined circuit; a process of simulating reference data representing electrical characteristics of circuit components composing the designed circuit; and a process of detecting electrical characteristics of the circuit components and comparing the detected electrical characteristics with the reference data.

The designed-circuit-verifying method is also referred to hereafter as an invention verification method.

In accordance with the invention verification method, for a circuit component of a designed circuit, electrical characteristics of the circuit component are detected by simulation and compared with reference data. Thus, an electrical characteristic different from the reference data or the location of a circuit component having such an electrical characteristic can be identified with ease. On the basis of the result of comparison, it is possible to show an electrical characteristic different from the reference data on a display of a circuit component exhibiting the electrical characteristic. By showing such an electrical characteristic on a display of the circuit component, the designed circuit can be corrected with ease. As a result, it is possible to provide a method of verifying a designed circuit to increase a design efficiency.

It is desirable to provide an invention verification method for comparing an electrical characteristic of each circuit component employed in a designed circuit with reference data and identifying an electrical component to be corrected on the basis of the result of comparison so as to allow the designed circuit to be corrected with ease.

It is thus desirable to further provide an invention verification method with: a process of displaying reference data representing an electrical characteristic of a circuit component employed in a designed circuit on a computer screen if necessary; a process of fetching detected data of the electrical characteristic of the circuit component; a process of comparing the fetched electrical characteristic with the reference data and forming a judgment on a result of comparison; and a process of displaying a result of the judgment on the computer screen.

In this case, it is desirable to select at least one electrical characteristic to be detected among a group of electrical characteristics including a voltage applied to a power-supply wire, a voltage drop, a power consumption, a current and a current direction, which are observable for each circuit component employed in the designed circuit.

To put it in detail, after simulation of voltage drops and others on the computer screen is ended, on the basis of comparison of an analysis result with reference data and on the basis of a judgment on a result of the comparison, detected data are fetched. For example, in addition to displays of a voltage drop along a Vdd wire, a voltage drop at a via hole, a ground bounce on a Vss wire and a ground bounce at a via hole, voltages supplied to a cell and a macro or an LSI are also displayed. In the case of a cell to which voltages Vdd and Vss are supplied, for example, a difference in electrical potential between the voltages Vdd and Vss is displayed. As an alternative, a sum of a voltage drop of the voltage Vdd and a ground bounce of the voltage Vss is displayed. The displays are graphical displays, which are colored in accordance with their values, or ASCII outputs sorted in the order of ascending/descending values.

As another example, the direction of a current flowing through a wire is displayed so as to allow the design engineer to verify that the current indeed flows in a direction intended by the engineer. In addition, in case a current flows in a direction opposite to the supposed direction, that is, in case a current flows out from a terminal of a macro or a cell instead of flowing into the terminal as expected, or flows into a terminal of a macro or a cell instead of flowing out from the terminal as expected, the display also includes a warning identifying the terminal.

As a further example, a power consumption (or a current) per unit area of a cell or a macro is computed and displayed in a color depending on the value of the power consumption (or the current) or output at a location among those arranged in an ASCII sort. A power consumption (or a current) per unit area of a cell or a macro is defined as a ratio of a power consumption (or a current) of the cell or the macro to the area of the cell or the macro.

It is desirable to select at least one electrical characteristic to be detected among a group of electrical characteristics including a current or the density of a current flowing through each connection hole of every circuit component, a current or the density of a current flowing through each wire, a current or the density of a current flowing through a multi-layer wiring substrate, a supplied voltage, a voltage drop and the location of each connection hole.

As a still further example, the display includes a warning identifying a via hole, a contact or a wire, through which almost no current is flowing or a current smaller than a specified magnitude or a current having a density smaller than a specified value is flowing. Such via holes, contacts and wires are displayed in a sorted order of typically ascending values. Portions of wires having electric potentials different from each other may be located at positions of the same planar coordinates but pertain to different layers. In case a difference in power-supply voltage drop between such wire portions is greater than a specified value, the coordinates of the positions of the wire portions are identified and a warning for creation of a via hole is issued.

The user is also allowed to determine whether or not to display such information in dependence on typically the distance between layers or the number of layers. In addition, if a signal line is sandwiched between 2 power-supply-wiring layers in a multi-layer structure, the user is allowed to select an option of displaying no warning.

The above and the other objects, features and advantages of the present invention will be apparent from the following detailed description of the preferred embodiment of the invention in conjunction with the accompanying drawings.

DETAILED DESCRIPTION OF THE PREFERRED EMBODIMENT

An embodiment of the present invention is explained concretely by referring to the diagrams.

There is a variety of methods of voltage-drop simulation. In accordance with a typical method of voltage-drop simulation, the power consumption of each cell is found by logic simulation, and the parasitic resistance as well the stray capacitance of a power-supply wire are computed from layout data. The power consumption, the parasitic resistance and the stray capacitance are combined to create a net list, and a voltage drop along the wire as well as a voltage drop at the cell are finally found.

In addition, there has been reported a number of programs for displaying results by outputting voltage drops and current densities as ASCII data or as computer graphics with colors varying in dependence on the values of the results.

In this embodiment, however, simulation of typically a voltage drop along a power-supply wire of an LSI is carried out as described above. After the simulation is ended, data based on the results of analysis are displayed as described below to improve the design efficiency.

Figure 1:
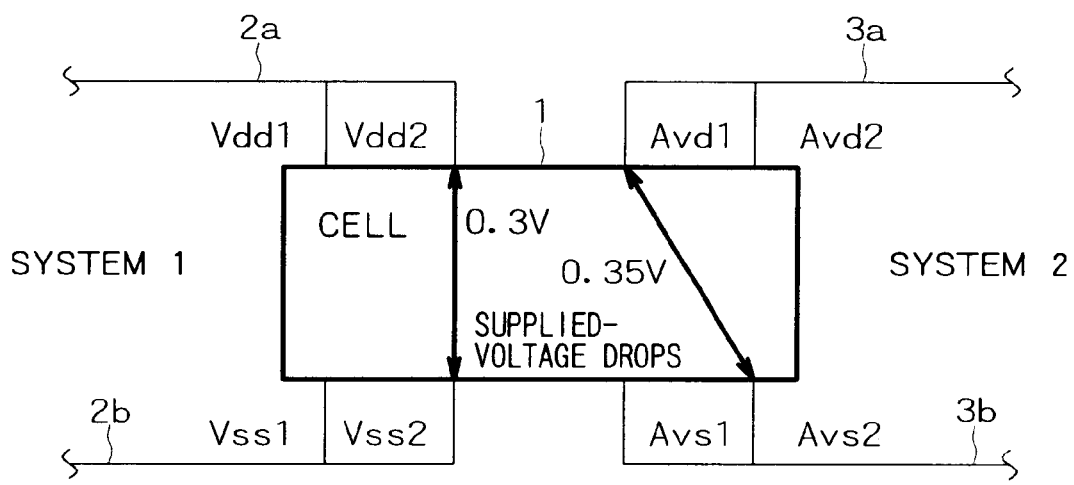
FIG. 1 is a schematic diagram showing typical drops in supplied voltage in accordance with an embodiment of the present invention.

FIG. 1 is a diagram showing drops in voltages supplied to a cell. To be more specific, the figure shows a voltage drop occurring on a power-supply-side wire 2a relative to a ground-side wire 2b in power-supply system 1 for a cell 1 and a voltage drop occurring on a power-supply-side wire 3a relative to a ground-side wire 3b in power-supply system 2 for the same cell.

To put it in detail, voltage drops of powers supplied to terminals of a cell or a LSI are input to a computer screen and the largest value among the voltage drops on the power-supply side is found for each power-supply system.

By the same token, ground bounces of the powers are input to the computer screen and the largest value among the ground bounces on the ground side is found for each power-supply system. Then, the sum of the largest value among the voltage drops on the power-supply side and the largest value among the ground bounces on the ground side is found for each of the power-supply systems. Each of the sums is displayed as a voltage drop of the power supplied to the cell or the LSI.

For example, power-supply systems are connected to the cell 1 as systems 1 and 2 as shown in FIG. 1. The cell 1 has terminals Vdd1 and Vdd2 connected to system 1 by the power-supply-side wire 2a and terminals Vss1 and Vss2 connected to system 1 by the ground-side wire 2b. By the same token, the cell 1 is also provided with terminals Avd1 and Avd2 connected to system 2 by the power-supply-side wire 3a and terminals Avs1 and Avs2 connected to system 2 by the ground-side wire 3b. Systems 1 and 2 each apply a voltage of 1.5 V to the cell 1. The power-supply voltage drops at the power-supply-side terminals and the ground bounces at the ground-side terminals are Vdd1=0.1 V, Vdd2=0.2 V, Vss1=0.1 V, Vss2=0.05 V, Avd1=0.15 V, Avd2=0.1 V, Avs1=0.15 V and Avs2=0.2 V.

First of all, the largest value among the voltage drops at the terminals Vdd1 and Vdd2 of power-supply system 1 is found. In this example, the largest value is the voltage drop Vdd2 of 0.2 V. Then, the largest value among the ground bounces at the terminals Vss1 and Vss2 of power-supply system 1 is found. In this example, the largest value is the ground bounce Vss1 of 0.1 V. Thus, the voltage drop of a power supplied by power-supply system 1 is found to be 0.3 V which is the sum of the voltage drop Vdd2 and the ground bounce Vss1. By the same token, the voltage drop of a power supplied by power-supply system 2 is found to be 0.35 V which is the sum of the voltage drop Avd1 and the ground bounce Avs2.

Then, these pieces of information are displayed as drops in power-supply voltage for the cell 1. The display includes the name of the cell 1 as well as the names of power-supply systems 1 and 2 along with their drops in power-supply voltage. In place of the drops in power-supply voltage, the display may include net voltages applied by the power-supply systems to the cell 1. The net voltages are obtained by subtracting the drops in power-supply voltage from the original voltages generated by the power-supply systems 1 and 2.

Figure 2:
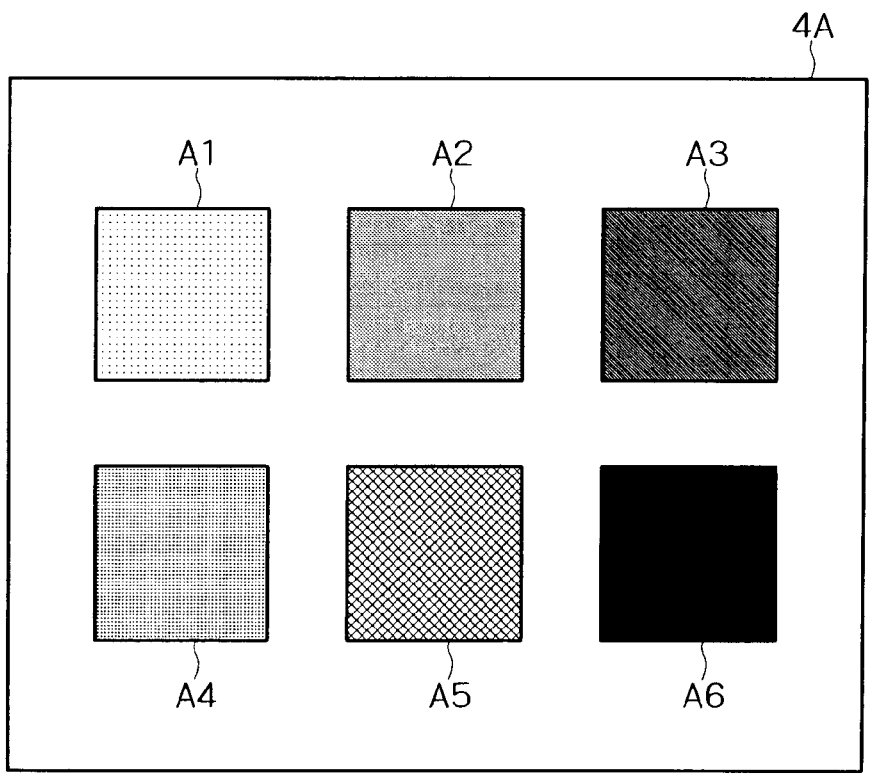
FIG. 2 is a diagram showing typical displays according to the same embodiment.

FIG. 2 is a typical display showing the drops in power-supply voltage, which are included in the display shown in FIG. 1.

To be more specific, typical display 1 in FIG. 2 shows the name of a cell as well as numerical values of voltage drops for power-supply systems 1 and 2.

Typical display 2 in FIG. 2 shows the name of a cell as well as numerical values of net voltages actually supplied by power-supply systems 1 and 2.

Typical display 3 in FIG. 2 shows cells or macros A1 to A6 colored differently in accordance with the values of voltage drops or net voltages actually applied by power supply systems in a display area 4A. The meanings of colors applied to the cells or macros A1 to A6 need to be determined in advance.

Figure 3A:
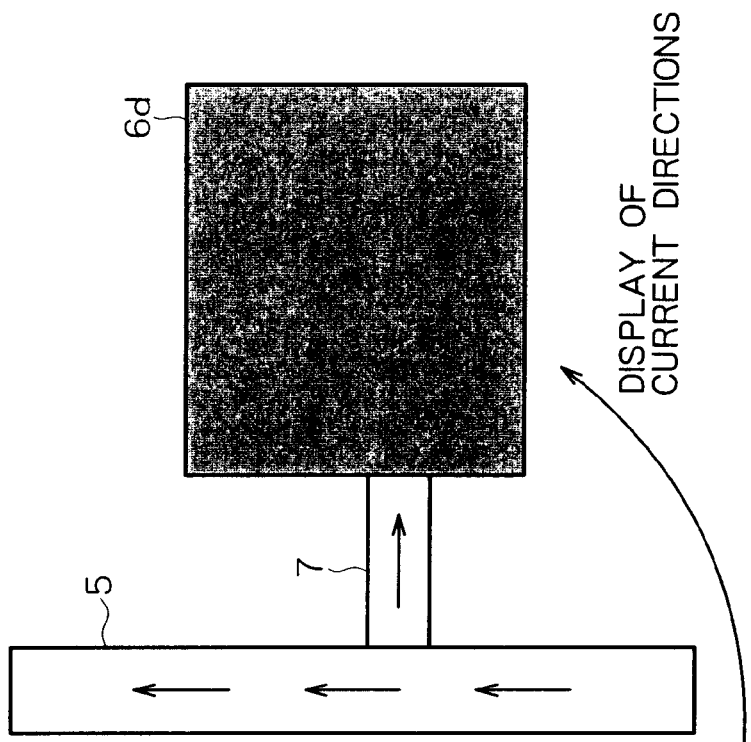
FIGS. 3A and 3B are diagrams showing typical displays according to the same embodiment.
Figure 3B:
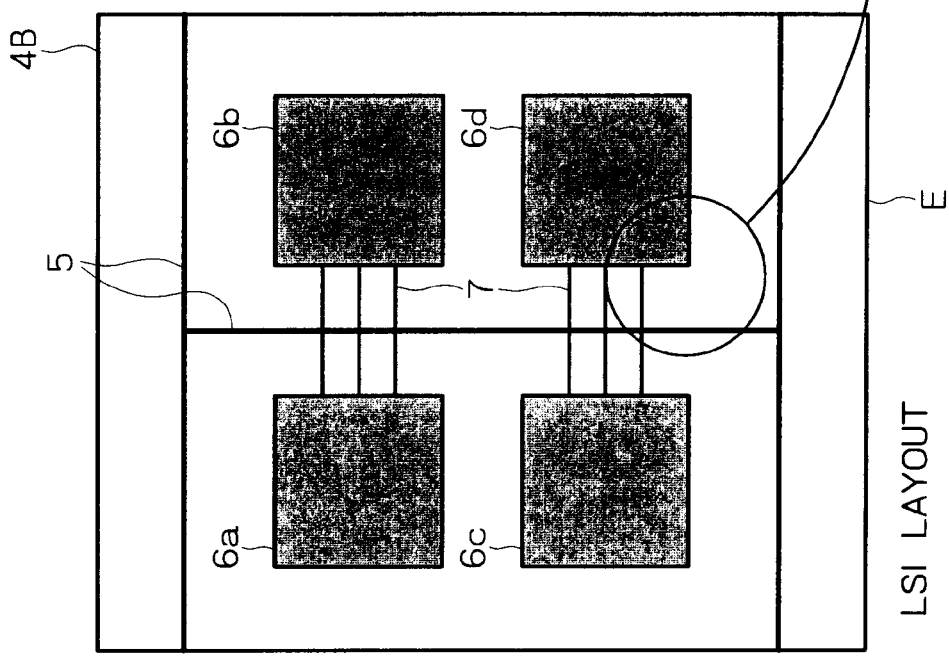

FIGS. 3A and 3B are diagrams each showing the directions of currents flowing to macros in a designed circuit.

To be more specific, FIG. 3A shows a layout of macros 6a to 6d as well as wires 5 and 7 in a display area 4B. FIG. 3B is a diagram showing an enlarged partial area E of the layout as well as the direction of a current flowing through the wire 5 and the direction of a current flowing from the wire 5 to the macro 6d through the wire 7. The directions of the currents are each explicitly represented by arrows allowing the directions to be verified with ease.

Figure 4:
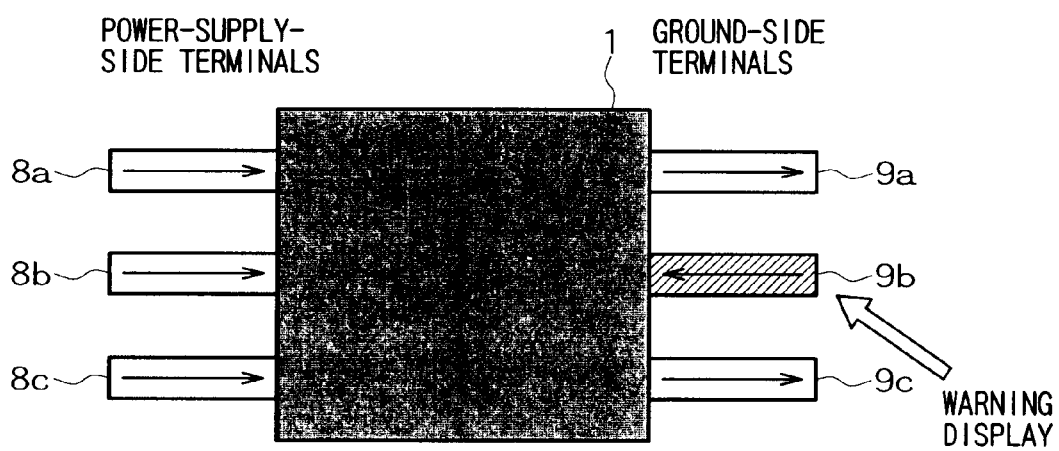
FIG. 4 is a diagram showing typical displays according to the same embodiment.

FIG. 4 is a typical diagram showing a location detected by an analysis based on simulation as a location at which a current is flowing in a direction opposite to the supposed direction.

That is to say, normally, currents flow into a cell or a macro through power-supply-system terminals 8a to 8c and flow out from the cell or the macro through ground-system terminals 9a to 9c as shown in typical display 2. As shown in the same figure, however, a current flows through the ground-system terminal 9b in a direction opposite to the supposed direction and a warning indicates the location of a wire connected to the terminal 9b.

To be more specific, typical display 1 in FIG. 4 shows coordinates of the location at which a current is flowing in a direction opposite to the supposed direction. The display shows coordinates X1=1,000 and Y1=500. Typical display 2 in FIG. 4 shows a typical graphical display. As shown in the figure, the ground-system terminal 9b and the wire connected to the terminal 9b are displayed in a color different from the rest. The figure also shows a warning display indicating the location of the wire connected to the ground-system terminal 9b.

Figure 5:
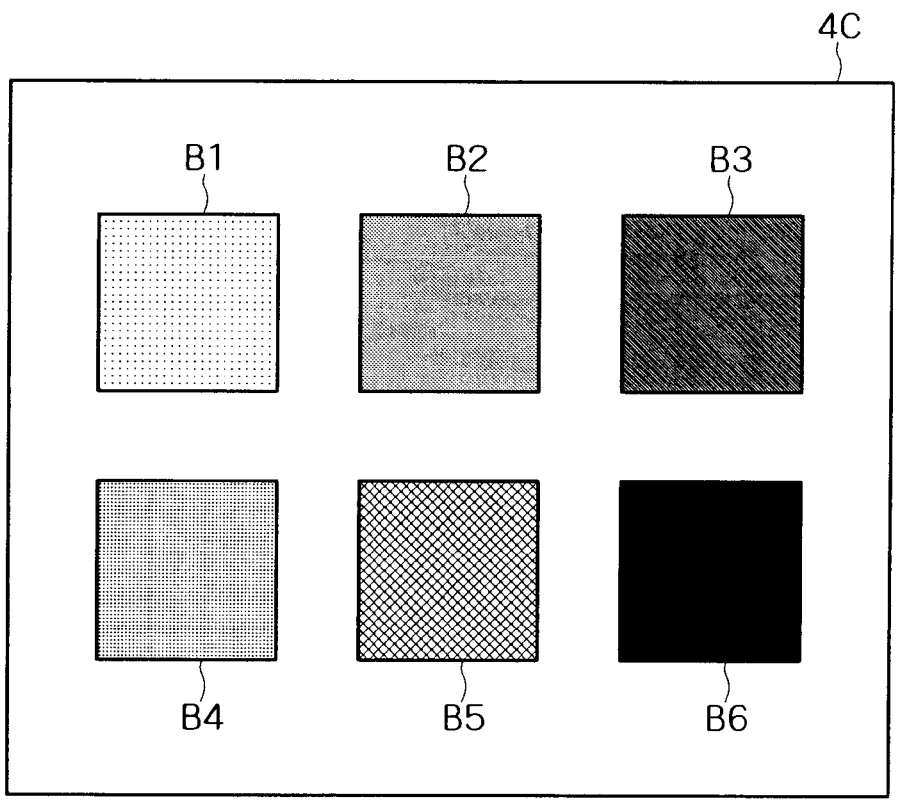
FIG. 5 is a diagram showing typical displays according to the same embodiment.

FIG. 5 is a diagram showing power consumptions.

A power consumption (or a current) per unit area is computed for a region occupied by a cell or a macro. That is to say, a power or a current consumed by a cell or a macro is divided by the area of a region occupied by the cell of the macro, being converted into a power consumption (or a current) per unit area. Power consumptions (or currents) per unit area are then sorted into an ascending or a descending order. As an alternative, the power consumptions (or the currents) per unit area are displayed in as graphical representations with colors varying in dependence on the values of the power consumptions (or the currents) per unit area.

For example, in typical display 1 shown in FIG. 5, names of cells and power consumptions (or currents) per unit area for the cells are displayed in an ASCII format, being arranged in the order of descending values of the power consumptions (or the currents) per unit area.

As another example, in typical display 2 appearing in a display area 4C as shown in typical display 2 in FIG. 5, power consumptions (or currents) per unit area for cells and macros B1 to B6 are displayed as graphical representations with colors varying in dependence on the values of the power consumptions (or the currents) per unit area. Also, in this case, the meanings of the colors applied to the cells or macros B1 to B6 need to be determined in advance.

Figure 6:
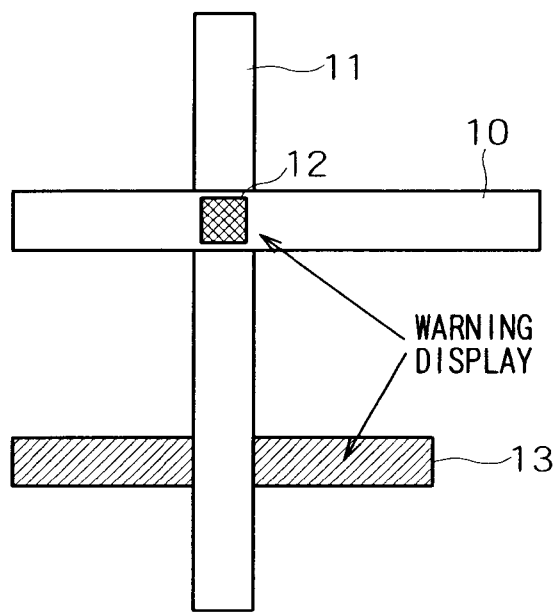
FIG. 6 is a diagram showing typical displays according to the same embodiment.

FIG. 6 is a diagram showing typical displays of locations of inactive wires detected as a result of an analysis based on simulation.

A result of an analysis outputs a warning identifying coordinates of a wire or a via hole, through which almost no current flows or a warning identifying coordinates of a wire or a via hole, through which only a current with a magnitude or a density smaller than a value specified by the user flows. Such locations can each be displayed as ASCII data or as graphical representations with colors varying in dependence on the magnitudes of the currents.

For example, in typical display 1 shown in FIG. 6, warnings are each displayed to indicate coordinates X1 and Y1 of a wire or a via hole, through which only a current with a small magnitude or a small density flows.

As another example, in typical display 2 shown in FIG. 6, a via hole 12 connecting an A wire 10 on a layer to a B wire 11 on another layer and a C wire 13 are each pointed out as an inactive location in a multi-layer structure. As shown in the figure, the via hole 12 and the C wire 13 are each displayed in a color different from the rest.

Figure 7:
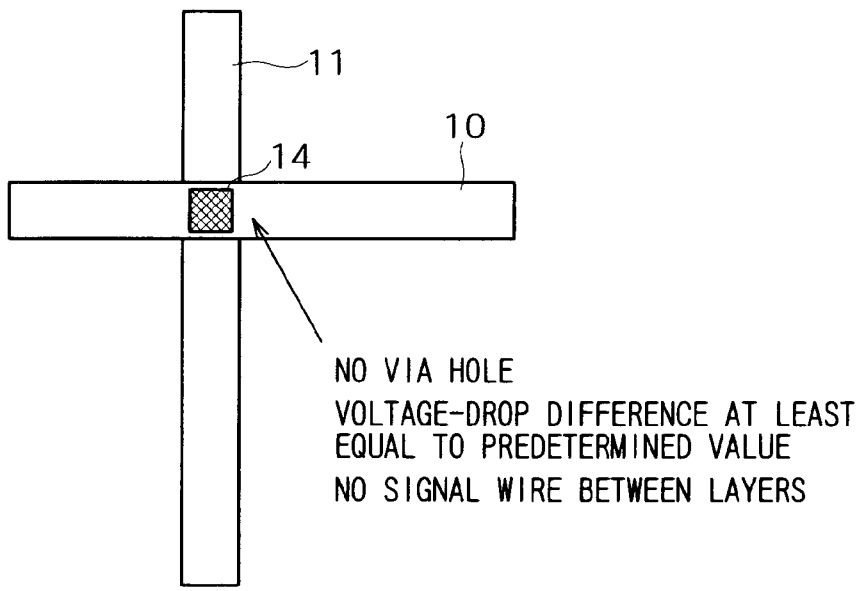
FIG. 7 is a diagram showing typical displays according to the same embodiment.

FIG. 7 is a diagram showing typical displays showing warnings suggesting the addition of via holes at particular locations detected as a result of an analysis based on simulation.

Power-supply wires of different layers in a multi-layer structure may be laid out to pass through respective layer points having the same planar coordinates. If the points on the different layers are not connected to each other by a via hole and the difference in voltage drop between the two points is at least equal to a predetermined value, a warning is displayed to indicate the common planar coordinates of the points. The predetermined value can be a default value or a value specified by the user.

For example, in typical display 1 shown in FIG. 7, warnings are each displayed to indicate planar coordinates X1 and Y1 of a location with no via hole and a difference in voltage drop at the location.

As another example, in typical display 2 shown in FIG. 7, a warning is shown to indicate a location at which a via hole 14 is to be added to connect an A wire 10 on a layer to a B wire 11 on another layer in a multi-layer structure.

To put it in detail, the A wire 10 on a layer crosses the B wire 11 on another layer at a location as shown in FIG. 7. At the location, however, the via hole 14 does not exist and, in addition, a difference in voltage drop at the location is at least equal to a predetermined value. In this case, a warning is displayed to point out the location. In dependence on the distance between two adjacent layers or the number of layers, however, such a warning may or may not be displayed.

In accordance with this embodiment, a designed circuit of power-supply wires used in an LSI is analyzed by simulation whereby electrical characteristics are compared with their respective pieces of reference data to detect an electrical characteristic different from its reference data, and the location of such an electrical characteristic is displayed on the basis of a result of detection. It is thus possible to provide remarkable effects 1 to 6 described as follows:

1: It is possible to easily form a judgment as to whether or not an expected voltage is supplied to each device portion of an LSI or a wiring-substrate circuit.

2: It is possible to verify whether a current is flowing in an expected direction and whether a micro bypasses a current to another portion as well as to easily determine a location to which a power-supply pad is to be added.

3: A direction is given to point out a location at which an unexpected current is flowing.

4: It is possible to determine intuitively which portion consumes a large current, and a direction is given to provide an optimum power-supply wire.

5: The method provided by the present invention is useful for deletion of an all but ineffective wire. In addition, an unconnected wire or an uncreated via hole due to incorrect wiring can be detected with ease.

6: A forgotten process to bore a via hole can be verified. Such verification serves as a direction for correcting the effect of a voltage. In addition, by displaying specified values in a gradually descending order starting with a value large to a certain extent, it is possible to classify the display by candidates for a location through which a via hole is to be bored and by their levels of priority.

It is possible to make a variety of changes and modifications based on technological concepts of the invention to the embodiment.

For example, it is possible to adopt a display method other than those implemented by the embodiment whereby information is displayed in terms of coordinates, as graphical representations or in terms of numerical values.

In addition, a location of an abnormality can also be displayed by combination of the display methods.

As described above, the present invention provides a designed-circuit-verifying method including a process of designing a predetermined circuit; a process of simulating reference data representing electrical characteristics of circuit components composing the designed circuit; and a process of detecting electrical characteristics of the circuit components and comparing the detected electrical characteristics with the reference data.

Thus, for a circuit component of a designed circuit, electrical characteristics of the circuit component can be detected by simulation and compared with reference data, making it possible to identify an electrical characteristic different from the reference data or the location of a circuit component having such an electrical characteristic with ease. On the basis of the result of comparison, it is possible to show an electrical characteristic different from the reference data on a display of a circuit component exhibiting the electrical characteristic. By showing such an electrical characteristic on a display of the circuit component, the designed circuit can be corrected with ease. As a result, it is possible to provide a method of verifying a designed circuit to increase a design efficiency.

While the preferred embodiment of the present invention have been described using the specific terms, such description is for illustrative purposes only, and it is to be understood that changes and variations may be made without departing from the spirit or scope of the following claims.

What is claimed is:

1. A designed-circuit-verifying method for verifying a designed circuit at a design stage before actually constructing the designed circuit, the designed-circuit-verifying method comprising the steps of:

designing said designed circuit using circuit components;

simulating reference data representing expected electrical characteristics of the circuit components composing said designed circuit;

detecting simulated electrical characteristics of said circuit components and comparing said detected simulated electrical characteristics with said simulated reference data;

identifying at least one of said circuit components to be corrected on a basis of a result of comparison of said detected simulated electrical characteristics of said at least one circuit component and said simulated reference data so as to allow the designed circuit to be corrected before actually constructing the designed circuit;

displaying said simulated reference data representing at least one electrical characteristic of said circuit component employed in said designed circuit on a computer screen;

fetching said detected simulated data of at least one electrical characteristic of said circuit component;

comparing said fetched at least one electrical characteristic with said simulated reference data and forming a judgment on a result of comparison; and displaying the result of said judgment on said computer screen.

2. A designed-circuit-verifying method according to claim 1 wherein the at least one electrical characteristic to be detected is selected among a group of electrical characteristics including a voltage applied to a power-supply wire, a voltage drop, a power consumption, a current and a current direction, which are observable for each circuit component employed in said designed circuit.

3. A designed-circuit-verifying method according to claim 1 wherein the at least one electrical characteristic to be detected is selected among a group of electrical characteristics including a current or the density of a current flowing through each connection hole of every circuit component, a current or the density of a current flowing through each wire, a current or the density of a current flowing through a multi-layer wiring substrate, a supplied voltage, a voltage drop and the location of each connection hole.

* * * * *